(12) United States Patent
Appenzeller et al.

(10) Patent No.: US 7,851,783 B2
(45) Date of Patent: *Dec. 14, 2010

(54) METHOD AND APPARATUS FOR FABRICATING A CARBON NANOTUBE TRANSISTOR

(75) Inventors: Joerg Appenzeller, Valhalla, NY (US); Phaedon Avouris, Yorktown Heights, NY (US); Yu-Ming Lin, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 141 days.

This patent is subject to a terminal disclaimer.

(21) Appl. No.: 12/164,690

(22) Filed: Jun. 30, 2008

(65) Prior Publication Data
US 2009/0032803 A1    Feb. 5, 2009

Related U.S. Application Data

(63) Continuation of application No. 11/553,331, filed on Oct. 26, 2006, now Pat. No. 7,482,232, which is a continuation of application No. 11/130,313, filed on May 16, 2005, now Pat. No. 7,141,727.

(51) Int. Cl.
*H01L 29/06* (2006.01)
*H01L 31/0328* (2006.01)
*H01L 31/0336* (2006.01)
*H01L 31/072* (2006.01)
*H01L 31/109* (2006.01)

(52) U.S. Cl. .................. 257/24; 257/20; 257/257; 257/321; 257/314; 257/350

(58) Field of Classification Search ............... 257/24, 257/318, 321, 350, 314
See application file for complete search history.

(56) References Cited

U.S. PATENT DOCUMENTS

| 6,972,467 | B2 * | 12/2005 | Zhang et al. ............ 257/401 |
| 7,141,727 | B1 * | 11/2006 | Appenzeller et al. ....... 257/20 |
| 2006/0011972 | A1 * | 1/2006 | Graham et al. ........... 257/324 |

* cited by examiner

*Primary Examiner*—Chuong A. Luu

(57) ABSTRACT

A method of fabricating a nanotube field-effect transistor having unipolar characteristics and a small inverse sub-threshold slope includes forming a local gate electrode beneath the nanotube between drain and source electrodes of the transistor and doping portions of the nanotube. In a further embodiment, the method includes forming at least one trench in the gate dielectric (e.g., a back gate dielectric) and back gate adjacent to the local gate electrode. Another aspect of the invention is a nanotube field-effect transistor fabricated using such a method.

13 Claims, 10 Drawing Sheets

METHOD AND APPARATUS FOR FABRICATING A CARBON NANOTUBE TRANSISTOR

CROSS REFERENCE TO RELATED APPLICATION

This application is a continuation of U.S. patent application Ser. No. 11/553,331, filed on Oct. 26, 2006 now U.S. Pat. No. 7,482,232, entitled "METHOD AND APPARATUS FOR FABRICATING A CARBON NANOTUBE TRANSISTOR", which is a continuation of U.S. patent application Ser. No. 11/130,313, filed May 16, 2005 now U.S. Pat. No. 7,141,727. Each of the prior applications noted above is incorporated herein by reference in its entirety.

BACKGROUND OF THE INVENTION

Field of the Invention

Complementary metal-oxide-semiconductor (CMOS) field-effect transistors are core elements of most microelectronic devices. The anticipated limits to further miniaturization of these transistors have led to the development of nanotube field-effect transistors (NFETs). The NFETs have demonstrated electrical characteristics comparable to or exceeding the ones of CMOS transistors.

The switching performance of NFETs and, specifically, carbon NFETs can be greatly improved by scaling the transistors to smaller size and, in particular, by reducing the thickness of the gate dielectric. However, in conventional—fully gated —NFETs, decreasing the thickness of the gate dielectric results in pronounced ambipolar behavior of the transistors and, as such, high OFF-currents and low ON/OFF current ratio. These phenomena occur because electrostatics of the nanotube at the metal electrodes rather than electrostatics of the bulk body of the nanotube dominate switching in such transistors.

Therefore, there is a need in the art for an improved method of fabricating a nanotube field-effect transistor.

SUMMARY OF THE INVENTION

The present invention discloses a method of fabricating nanotube field-effect transistors having unipolar characteristics and small inverse sub-threshold slopes. In one embodiment, the method includes forming a local gate electrode beneath the nanotube and between drain and source electrodes of the transistor and doping the nanotube in regions proximate to the gate electrode with e.g., $Cl_2$, $Br_2$, K, Na, molecules of polyethylenimine, and the like. In a further embodiment, the method includes forming at least one trench adjacent to the local gate electrode in the back gate dielectric and back gate layers of the transistor.

Another aspect of the invention is a nanotube field-effect transistor fabricated using the inventive method.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention discloses a method of fabricating a nanotube field-effect transistor (NFET) having unipolar characteristics and a small inverse sub-threshold slope by providing a local gate electrode beneath the nanotube and doping the nanotube in regions proximate to the local gate electrode. Herein, the term "nanotube" is interchangeably used for both a nanotube and a nanowire (i.e., nanotube without axial opening). The method may be used in fabrication of ultra-large-scale integrated (ULSI) circuits and devices.

Figure 1:
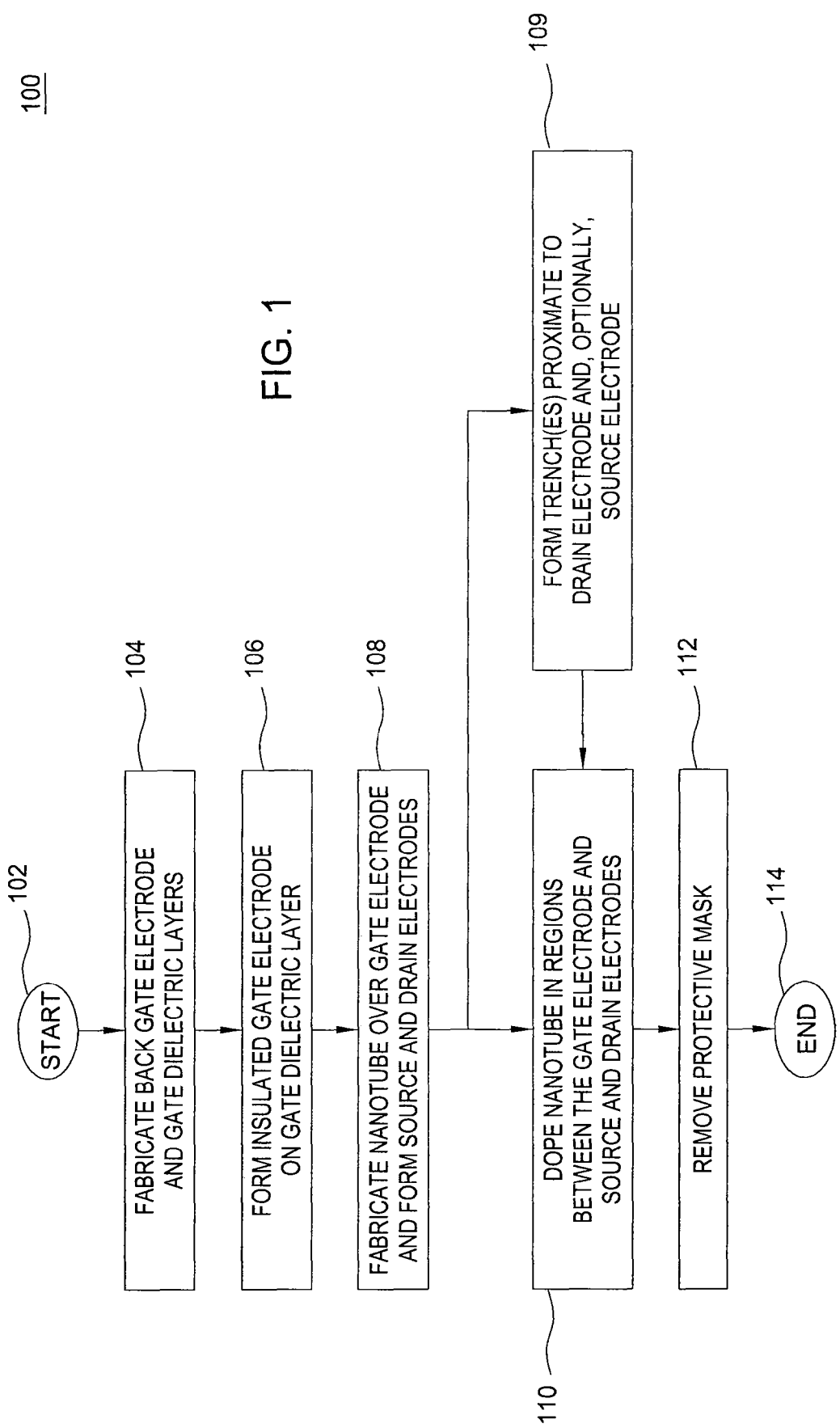
FIG. 1 depicts a flow diagram of a method of fabricating a nanotube field-effect transistor in accordance with one embodiment of the present invention.

FIG. 1 depicts a flow diagram of one embodiment of the inventive method 100 of fabricating an NFET. The method 100 includes processing steps that are performed upon a substrate where at least one such transistor is being fabricated. In one embodiment, such processing steps are sequentially performed in the depicted order. In alternate embodiments, at least two of these processing steps may be performed contemporaneously or in a different order. Sub-processes, such as an application and removal of lithographic masks or sacrificial and protective layers, cleaning processes, and the like, are well known in the art and, conventionally, are not shown in FIG. 1.

FIGS. 2A-2E and 3 depict a series of schematic, cross-sectional views of NFETs being fabricated in accordance with embodiments of the method of FIG. 1. The images in FIGS. 2A-2E and 3 are not depicted to scale and are simplified for illustrative purposes. To best understand the invention, the reader should simultaneously refer to FIG. 1 and FIGS. 2A-2E and 3.

Figure 2A:
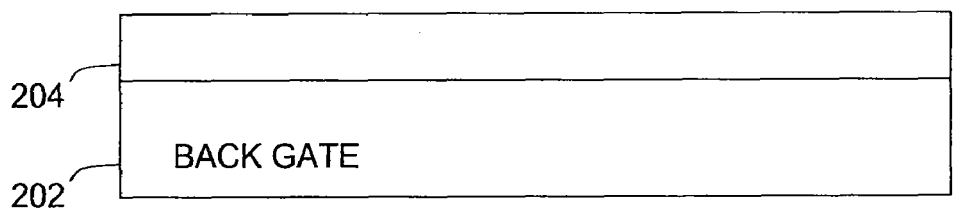
FIGS. 2A-2E depict a series of schematic, cross-sectional views of a nanotube field-effect transistor being fabricated in accordance with one embodiment of the method of FIG. 1.

The method 100 starts at step 102 and proceeds to step 104. At step 104, an optional back gate layer 202 (e.g., a back gate electrode) and a gate dielectric layer 204 are fabricated (FIG. 2A). In one embodiment, the back gate layer 202 is formed from silicon (Si) or degenerately doped silicon. In the depicted embodiment, the layer 202 is a portion of a silicon substrate (not shown). Alternatively, the back gate layer 202 may be deposited upon a substrate, such as a silicon or glass wafer, and the like.

The gate dielectric layer 204 is typically formed from at least one of silicon dioxide ($SiO_2$), hafnium dioxide ($HfO_2$), and alumina ($Al_2O_3$), quartz and the like dielectric materials. In one exemplary embodiment, the gate dielectric layer 204 is formed from $SiO_2$ to a thickness of about 1 to 10000 nm.

Figure 2B:
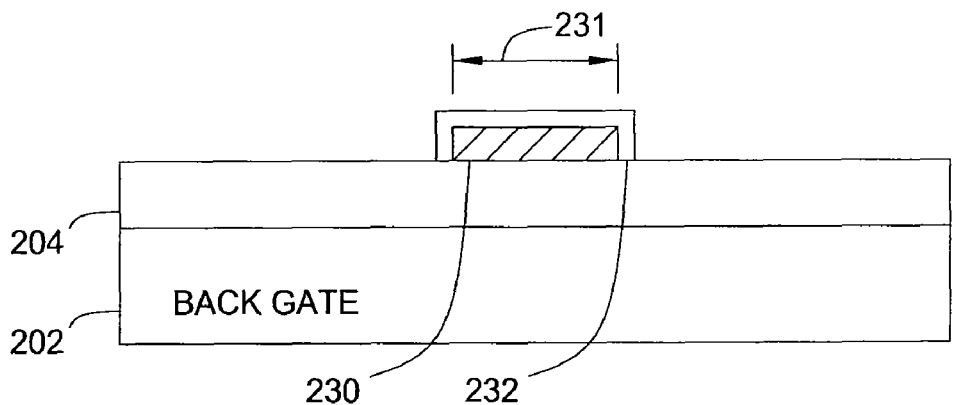

At step 106, a "local" gate electrode 230 is deposited on the gate dielectric layer 204 and an insulating (i.e., dielectric) layer 232 is formed over the local gate electrode (FIG. 2B). The gate electrode 230 may be formed from at least one of a metal (e.g., aluminum (Al), molybdenum (Mo), and the like) or another conductive material to a thickness of about 5 nm to 50 nm. Generally, the gate electrode 230 has a width 231 of about 5 to 200 nm, while a thickness of the insulating layer 232 is about 1 to 10 nm.

In one exemplary embodiment, the gate electrode 230 and the insulating layer 232 are formed from Al and $Al_2O_3$, respectively. In this embodiment, the Al gate electrode 230 is oxidized, at an elevated temperature of about 150° C., in an ambient environment or, alternatively, in moisturized oxygen ($O_2$) to form the $Al_2O_3$ insulating layer 232.

Figure 2C:
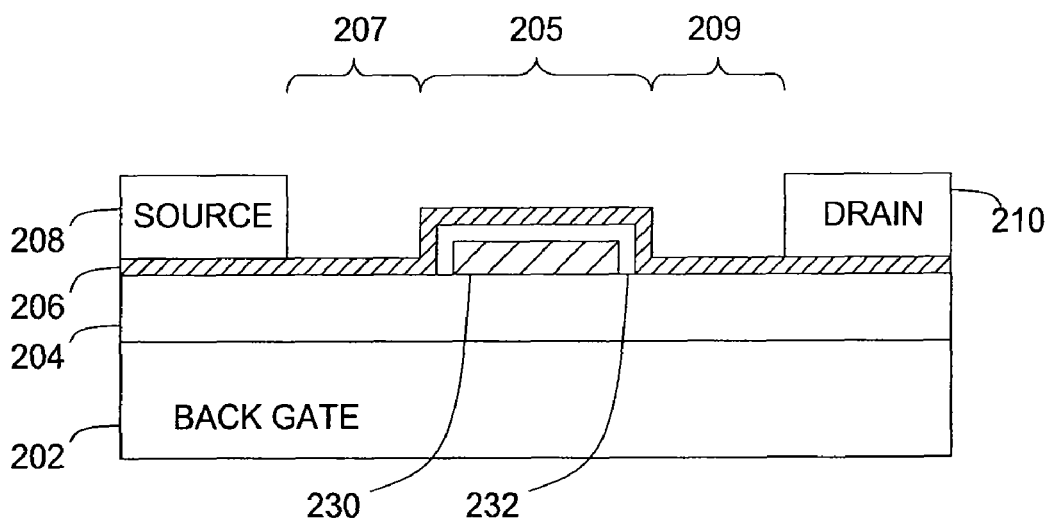

At step 108, a nanotube 206 is formed on the gate dielectric layer 204 and the insulating layer 232 and a source electrode 208 and a drain electrode 210 are formed on the nanotube (FIG. 2C). In one embodiment, the nanotube 206 is a semiconducting carbon (C) nanotube having an outer diameter of about 0.6-3 nm. In alternate embodiments, semiconducting nanotubes from other materials (e.g., Si, gallium arsenide (GaAs), indium phosphate (InP), indium gallium arsenide (InGaAs), and the like) may also be used. In the depicted embodiment, the nanotube 206 is disposed substantially orthogonally to an axis of longitudinal symmetry (not shown) of the gate electrode 230.

A channel region of the NFET being fabricated includes a central region 205 and peripheral regions 207 and 209 of the nanotube 206. The central region 205 is located over the local gate electrode 230 and the insulating layer 232, while the peripheral regions 207 and 209 are disposed between the region 205 and the source electrode 208 and the drain electrode 210, respectively. The regions 207, 209 generally have widths in a range of about 10 to 200 nm.

The source electrode 208 and the drain electrode 210 may be formed upon the nanotube 206 by depositing on the nanotube at least one of a metal, an alloy of a metal, or a conductive material. Suitable metals include, but are not limited to, aluminum (Al), copper (Cu), titanium (Ti), tantalum (Ta), gold (Au), palladium (Pd) and tungsten (W). The gate electrode 230, the insulating layer 232, and the electrodes 208 and 210 may be fabricated using conventional thin film techniques known to those skilled in the art.

Figure 2D:
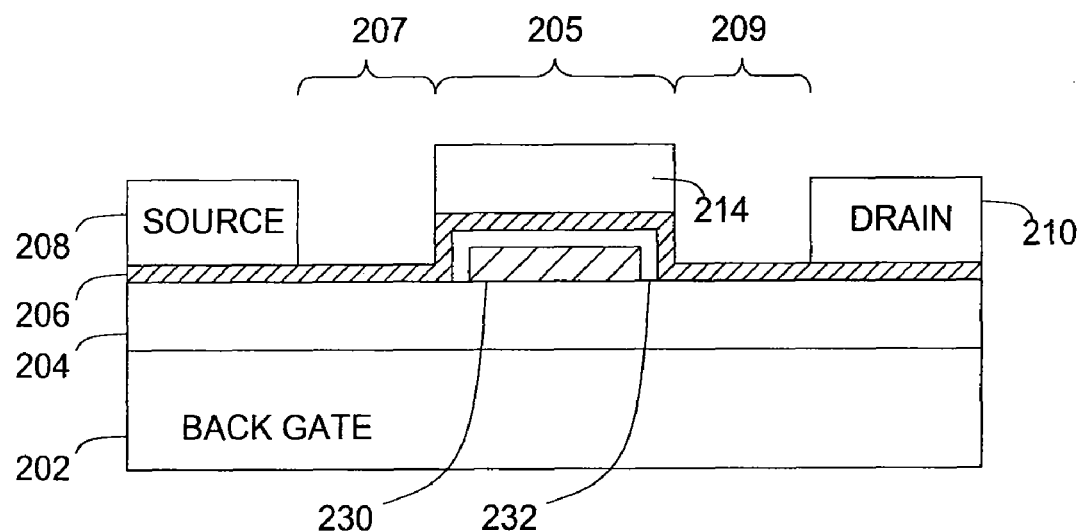

In one embodiment, after step 108, the method 100 proceeds to step 110. At step 110, a patterned photo-resist, e-beam-resist or hard mask 214 is formed on the nanotube 206 in the region 205. The nanotube is selectively doped in the regions 207 and 209 (FIG. 2D). In the nanotube 206, the dopants modify the Fermi-level of charge carriers. During a doping process, the resist mask 214 protects the nanotube in the region 205 from being doped. Optionally (not shown), the mask 214 may also be formed over the source electrode 208 and the drain electrode 210, however, the electrodes are generally not susceptive to dopants.

The mask 214 may be formed using a lithographic routine. In a further embodiment, the mask 214 may also be used as an etch mask to pattern the underlying insulating layer 232 and gate electrode 230 using, e.g., a wet etch process. Such an etch process is typically followed by a re-oxidation process that restores insulation (i.e. the layer 232) between the nanotube 206 and the gate electrode 230.

The doping process may use e.g., $Cl_2$, $Br_2$, K, Na, molecules of polyethylenimine and the like dopants. More specifically, the K, Na, molecules of polyethylenimine dopants may be used to fabricate n-i-n NFETs and the $Cl_2$, $Br_2$ dopants may be used to fabricate p-i-p NFETs, respectively. Typically, in the regions 207 and 209, the nanotube 206 is doped to achieve degenerate doping levels. To prevent damaging the nanotube 206, the dopants are generally applied in the form of a doping solution (i.e., in liquid phase). Alternatively, the dopants may be applied using an evaporation process.

Figure 2E:
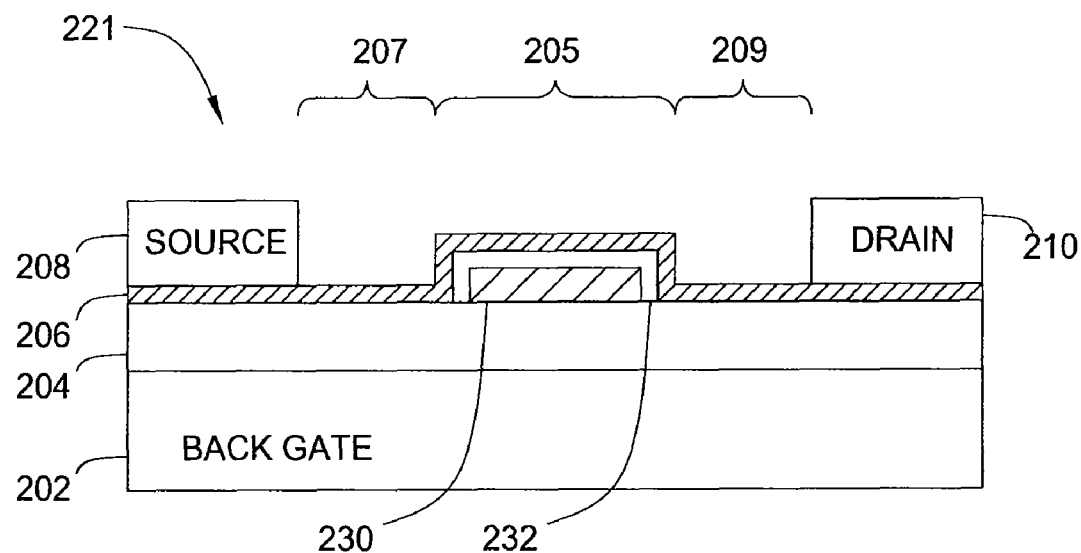

At step 112, upon completion of the doping process, the mask 214 is removed using, e.g., Acetone chemistry and, at step 114, the method 100 ends. FIG. 2E illustrates the resulting structure 221 after removal of the mask 214.

Figure 3:
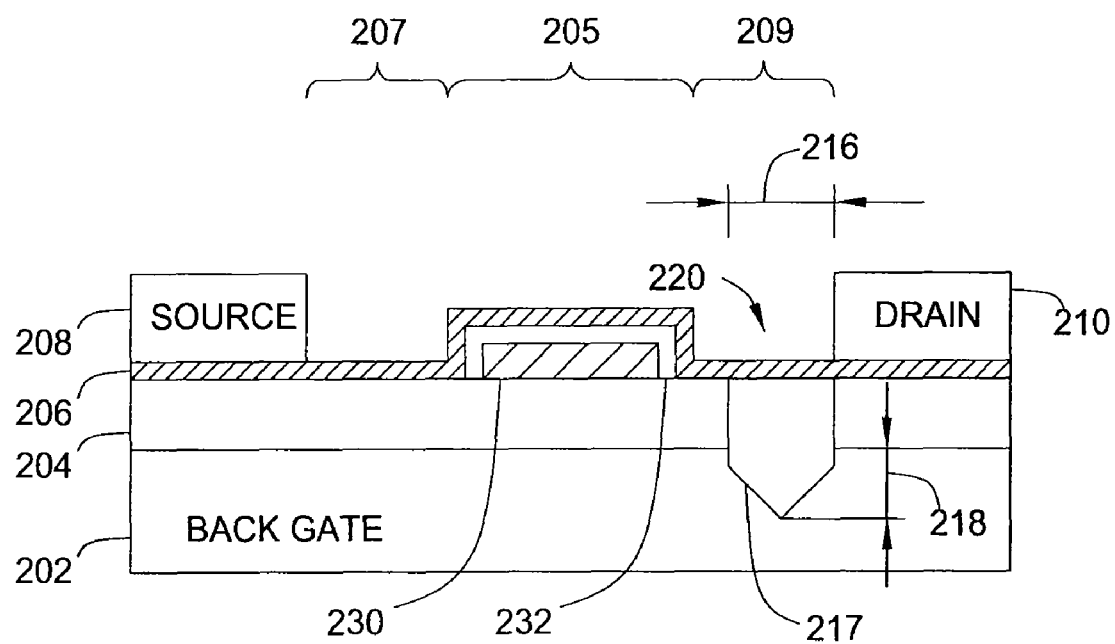
FIG. 3 depicts a schematic, cross-sectional view of a nanotube field-effect transistor being fabricated in accordance with another embodiment of the method of FIG. 1.

In an alternate embodiment, after step 108, the method 100 proceeds to step 109. At step 109, at least one trench 220 is formed in the gate dielectric layer 204 and the back gate layer 202 (FIG. 3). The trench(es) 220 is/are formed in the region 209 proximate to the drain electrode 210 and, optionally, in the region 207 proximate to the source electrode 208.

Each trench 220 is formed beneath the nanotube 206 to a width 216 of about 10 to 150 nm and represents, in the gate dielectric layer 204, a clear elongated opening and, in the back gate layer 202, a grove extending to a depth 218 of about 10 to 150 nm. In the depicted exemplary embodiment, one trench 220 is formed proximate to the drain electrode 210. In another embodiment (not shown), a second trench 220 may be formed proximate to the source electrode 208.

Typically, the trench 220 has a length of about 100 to 10000 nm and is disposed substantially perpendicular to the nanotube 206. Illustratively, sidewalls 217 of the trench 220 intersect at an angle of about 90°, however, trenches having other form factors may also be envisioned and are within the scope of the present invention. Disclosure of the trench formation will be described below. Upon completion of step 109, the method 100 proceeds to steps 110, 112, and 114, as discussed above in reference to FIGS. 2D-2E.

Figure 4:
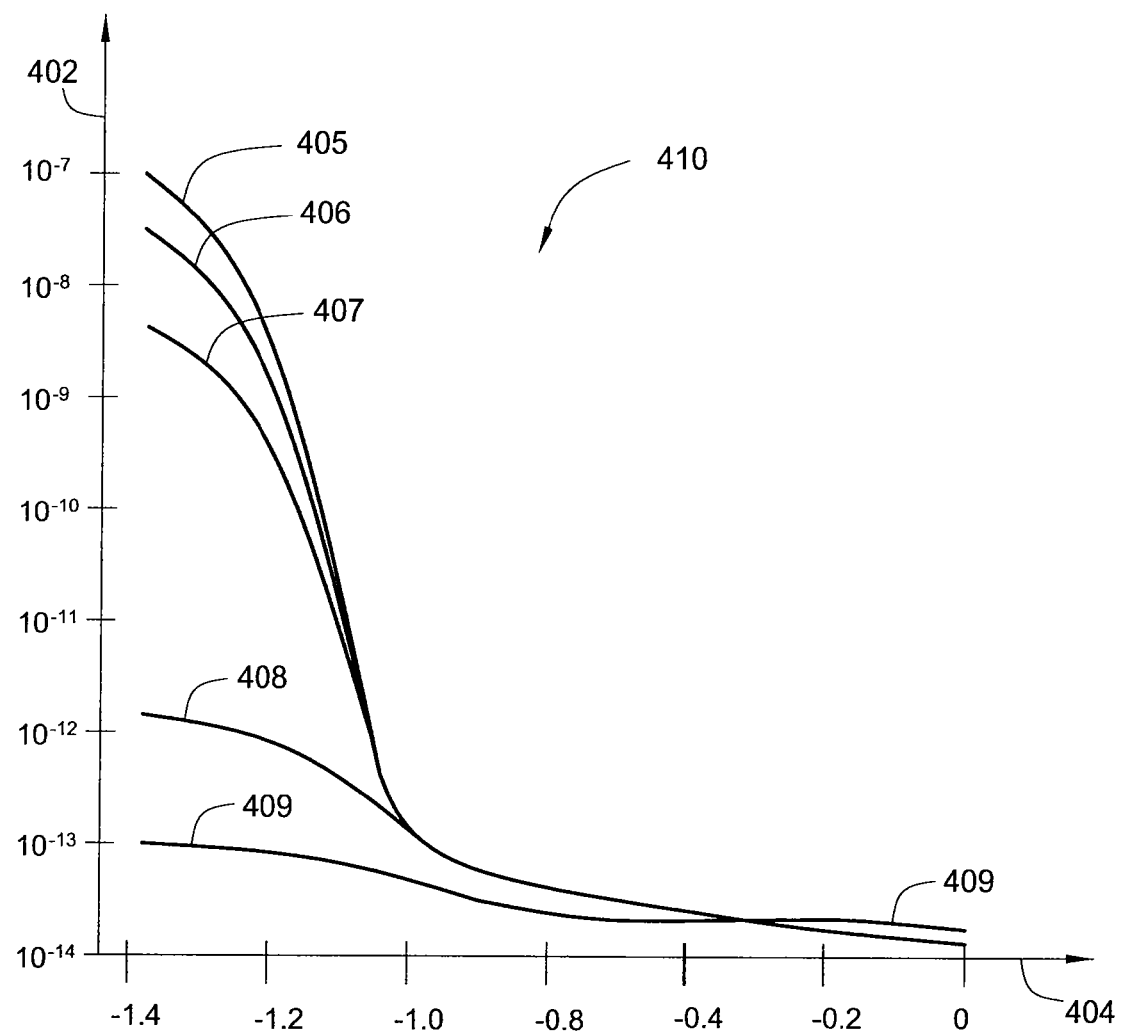
FIG. 4 depicts a graph illustrating characteristics of an exemplary nanotube field effect transistor fabricated using the method of FIG. 1.

FIG. 4 depicts a series 410 of exemplary graphs 405-409 illustrating dependence of an output current $I_d$ (y-axis 402, in unit of ampere) from a local gate electrode voltage $V_{gs}$ (x-axis 404, in unit of volt) of the p-type NFET 221 (discussed in reference to FIGS. 2A-2E above). The NFET 221 is fabricated using the method 100 of FIG. 1. The data points in the graphs 405-409 are acquired at a back gate electrode voltage $V_{bg}$ equal to −2.5V, −2.0V, −1.5V, −1.0V, and −0.5V, respectively, and a local gate electrode voltage $V_{gs}$ controlled within a range from −1.4V to 0V. At the mid-range voltage $V_{bg}=-1.5V$, the inverse sub-threshold slope of the transistor 221 is about 63 mV/dec and the corresponding ON/OFF current ratio is about $10^6$.

As such, in operating ranges of the gate electrode, drain, and back gate electrode voltages, the NFETs 221 have unipolar characteristics and a small inverse sub-threshold slope. In the embodiment, the NFETs 221 comprised the Al gate electrode 230, the $Al_2O_3$ insulating layer 232, and the gate dielectric layer 204 formed from $SiO_2$ to a thickness of about 10 nm. The carbon nanotubes 206 of the NFETs were electrostatically doped using the back gate 202 resulting in characteristics as shown in FIG. 4.

In one embodiment, the present invention discloses a method of fabricating a nanotube field-effect transistor (NFET) having unipolar characteristics by forming at least one trench in a gate dielectric layer and a back gate electrode of the transistor. Herein, the term "nanotube" is interchangeably used for both a nanotube and a nanowire (i.e., nanotube without axial opening). The method may be used in fabrication of ultra-large-scale integrated (ULSI) circuits and devices.

Figure 5:
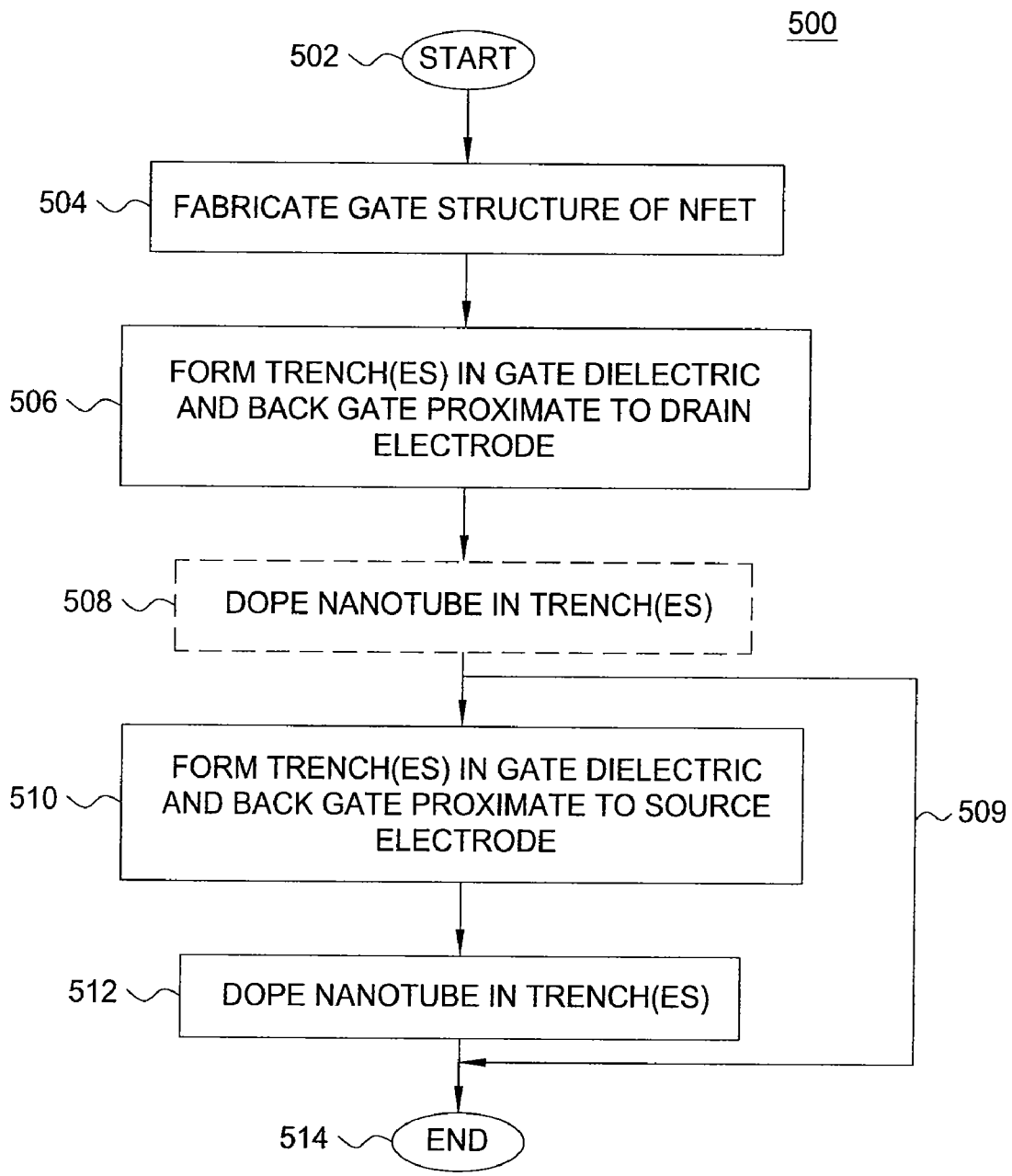
FIG. 5 depicts a flow diagram of a method of fabricating a nanotube field-effect transistor in accordance with one embodiment of the present invention.

FIG. 5 depicts a flow diagram of one embodiment of the inventive method 500 of fabricating a NFET. The method 500 includes processing steps that are performed upon a substrate where at least one such transistor is being fabricated. In one embodiment, such processing steps are sequentially performed in the depicted order. In alternate embodiments, at least two of these processing steps may be performed contemporaneously or in a different order. Sub-processes, such as an application and removal of lithographic masks or sacrificial and protective layers, cleaning processes, and the like, are well known in the art and, conventionally, are not shown in FIG. 5.

FIGS. 6A-6D and 7A-7B depict a series of schematic, cross-sectional views of NFETs being fabricated in accordance with embodiments of the method of FIG. 5. The images in FIGS. 6A-6D and 7A-7B are not depicted to scale and are simplified for illustrative purposes. To best understand the invention, the reader should simultaneously refer to FIG. 5 and FIGS. 6A-6D and 7A-7B.

Figure 6A:
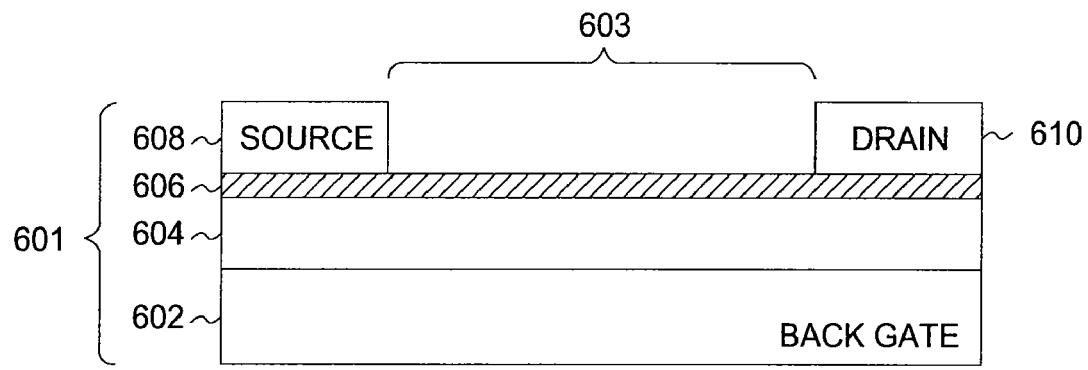
FIGS. 6A-6D depict a series of schematic, cross-sectional views of a nanotube field-effect transistor being fabricated in accordance with one embodiment of the method of FIG. 5.

The method 500 starts at step 502 and proceeds to step 504. At step 504, a structure 601 of the NFET is fabricated (FIG. 6A). The structure 601 illustratively comprises a back gate layer 602 which affects only one NFET, a gate dielectric layer 604, a nanotube 606, a source electrode 608, and a drain electrode 610. A channel of the NFET is defined in region 603 disposed in the nanotube 606 between the electrodes 608 and 610. The structure 601 may be fabricated using conventional thin film techniques known to those skilled in the art.

In one embodiment, the back gate layer 602 is formed from silicon (Si) or degenerately doped silicon. In the depicted embodiment, the layer 602 is a portion of a silicon substrate (not shown)—in this way ensuring independent operation of different NFETs. Alternatively, the back gate layer 602 may be deposited upon a substrate, such as a silicon or glass wafer, and the like. In another embodiment an oxidized SOI wafer can be used.

The gate dielectric layer 604 is typically formed from at least one of silicon dioxide ($SiO_2$), hafnium dioxide ($HfO_2$), and alumina ($Al_2O_3$), and the like dielectric materials. In one exemplary embodiment, the gate dielectric layer 604 is formed from $SiO_2$ to a thickness of about 1 to 10 nm.

In one embodiment, the nanotube 606 is a semiconducting carbon (C) nanotube having an outer diameter of about 0.6-3 nm. In alternate embodiments, semiconducting nanotubes from other materials (e.g., Si, gallium arsenide (GaAs), indium phosphate (InP), indium gallium arsenide (InGaAs), and the like) may also be used in the structure 601. The source electrode 608 and the drain electrode 610 are formed upon the nanotube 606 by depositing on the nanotube at least one of a metal, an alloy of a metal, or a conductive compound. Suitable metals include, but not limited to, aluminum (Al), copper (Cu), titanium (Ti), tantalum (Ta), and tungsten (W).

Figure 6B:
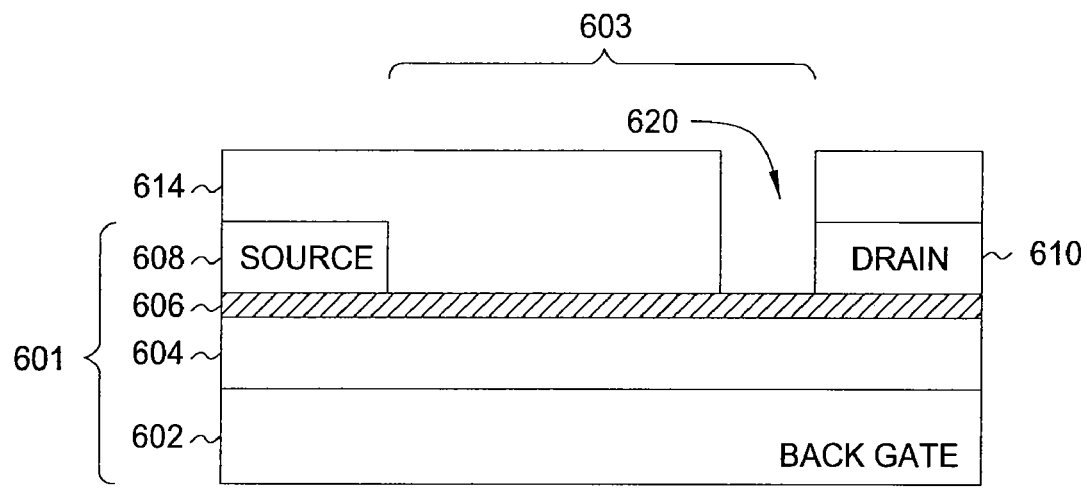
Figure 6C:
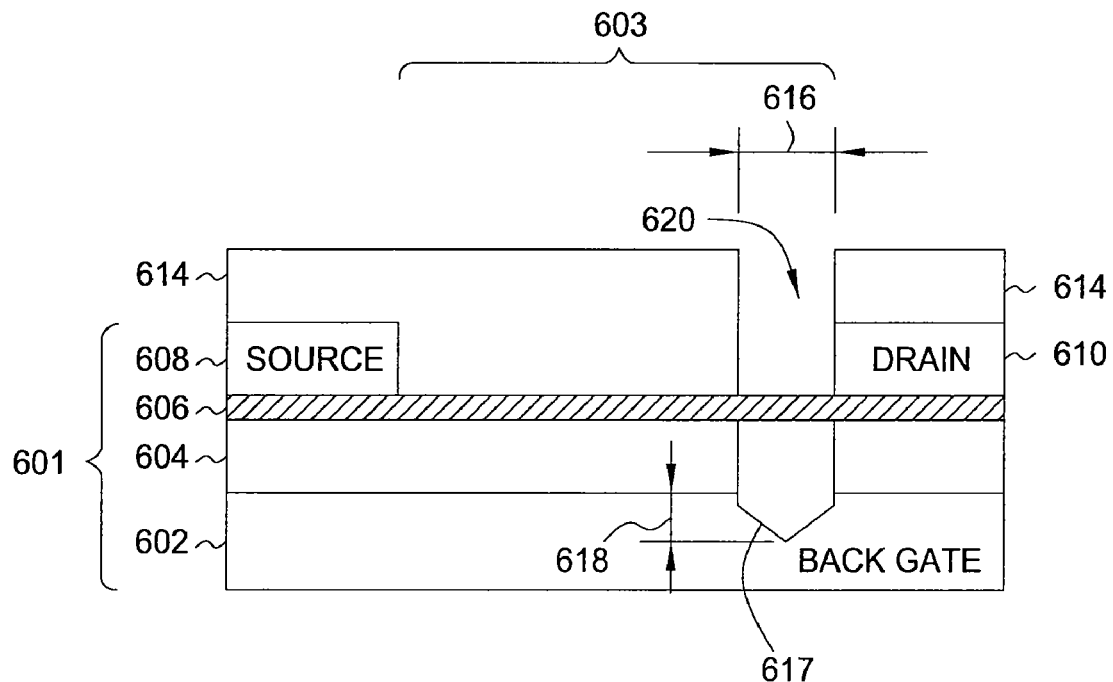

At step 506, at least one trench 620 is formed in the gate dielectric layer 604 and the back gate layer 602 in the channel region 603. The trench(es) 620 is/are disposed substantially perpendicular to the nanotube 606 proximate to the drain electrode 610. The presence of trench 620 reduces or eliminates the effect of the back gate 602 on the portion of the nanotube near the drain electrode 610, and provides a NFET having unipolar characteristics. In the depicted exemplary embodiment, a single trench 620 is illustratively shown (FIGS. 6B-6C). To form a trench, a patterned photo- (or e-beam) resist mask 614 is formed, using a lithographic routine, upon the structure 601 (FIG. 6B). Then, the gate dielectric layer 604 and the back gate layer 602 are etched using the mask 614 as an etch mask.

Each trench 620 is formed beneath the nanotube 606 to a width 616 of about 10 to 150 nm and represents, in the gate dielectric layer 604, a clear elongated opening and, in the back gate layer 602, a grove extending to a depth 618 of about 10 to 150 nm (FIG. 6C). Typically, such a trench has a length of about 100 to 10000 nm. Illustratively, sidewalls 617 of the trench 620 intersect at an angle of about 90°, however, trenches having other form factors may also be envisioned and are within the scope of the present invention.

In one embodiment, to form the trench 620, the $SiO_2$ gate dielectric layer 604 and the Si back gate layer 602 are etched using solutions of ammonia ($NH_3$) buffered hydrogen fluoride (HF) and saturated potassium hydroxide (KOH), respectively.

At step 508, the nanotube 606 is selectively doped in the trench 620 using e.g., $Cl_2$, $Br_2$, K, Na, molecules of polyethylenimine and the like dopants. More specifically, the K, Na, molecules of polyethylenimine dopants may be used to fabricate n-type NFETs and the $Cl_2$, $Br_2$ dopants may be to fabricate p-type NFETs, respectively. Typically, the nanotube 606 is doped to achieve degenerately doped nanotube segments. During a doping process, the photo- (e-beam) resist mask 614 protects the nanotube 606 from being doped in the channel region 603. In the nanotube 606, the dopants modify the Fermi level of charge carriers and allow using the trench 620 with a smaller width 616, while still providing unipolar characteristics for the NFET. As such, doping the nanotube 606 allows reducing a footprint of the NFETs being fabricated. To prevent damaging the nanotube 606, the dopants are generally applied in form of a doping solution (i.e., in liquid phase). Alternatively, the dopants may be applied using an evaporation process.

Figure 6D:
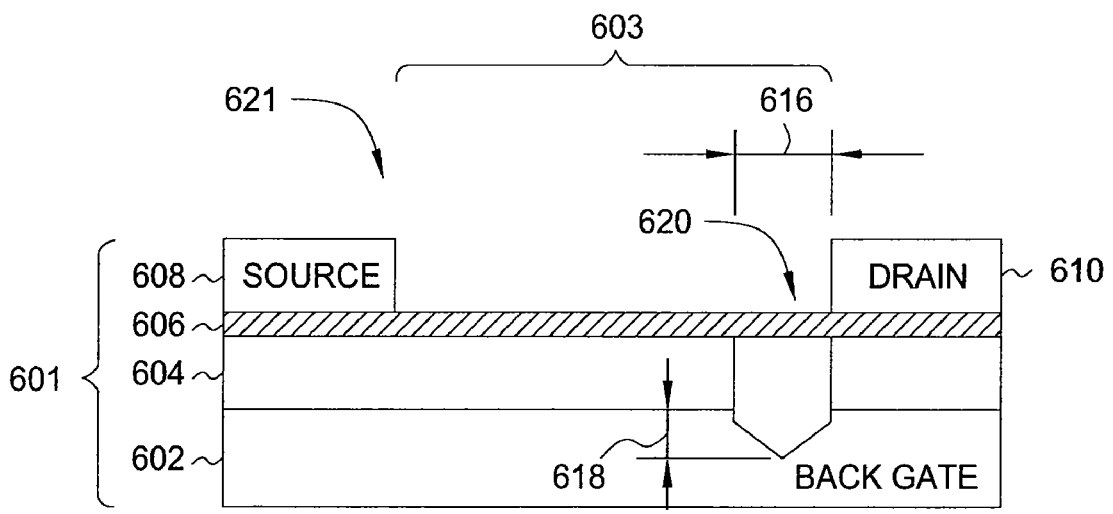

In one exemplary embodiment, selective doping the nanotube 606 in the trench 620 would allow for a reduced width 616 of the trench. However, when wide trenches 620 are used, the NFETs being fabricated are functional without doping the nanotube 606. Therefore, step 508 may be considered optional. Upon completion of the doping process, the photoresist mask 614 is removed using, e.g., Aceton chemistry (FIG. 6D).

In one embodiment, after step 508, the method 500 proceeds to step 514 (illustrated with a link 509) where the method 500 ends. In an alternate embodiment, after step 508, the method 500 proceeds to step 510.

Figure 7A:
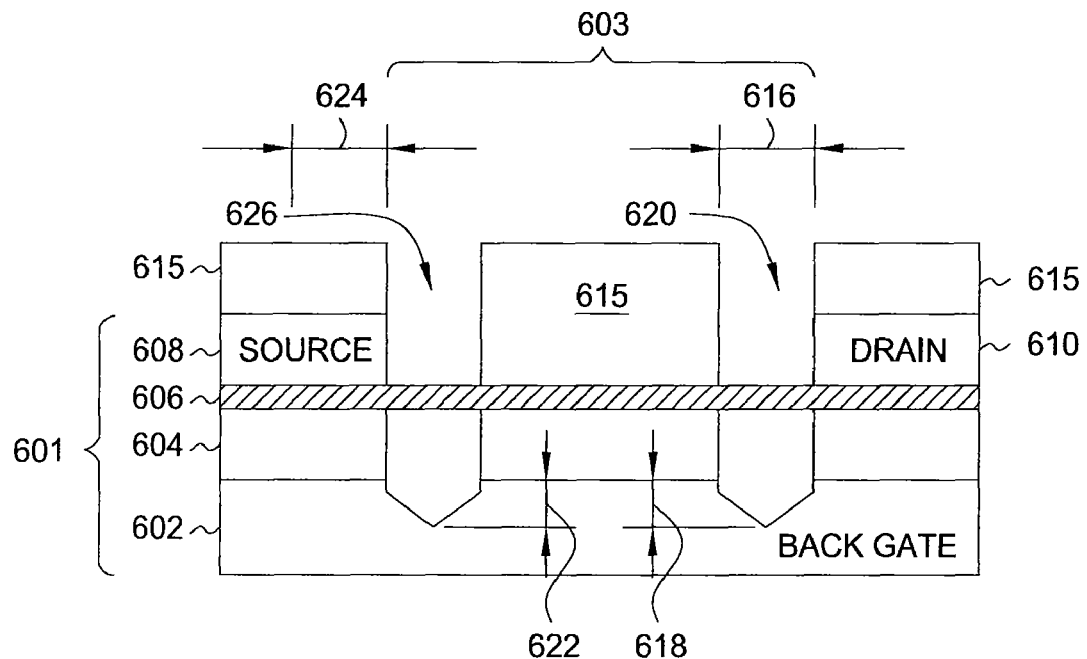
FIGS. 7A-7B depict a series of schematic, cross-sectional views of a nanotube field-effect transistor being fabricated in accordance with another embodiment of the method of FIG. 5.
Figure 7B:
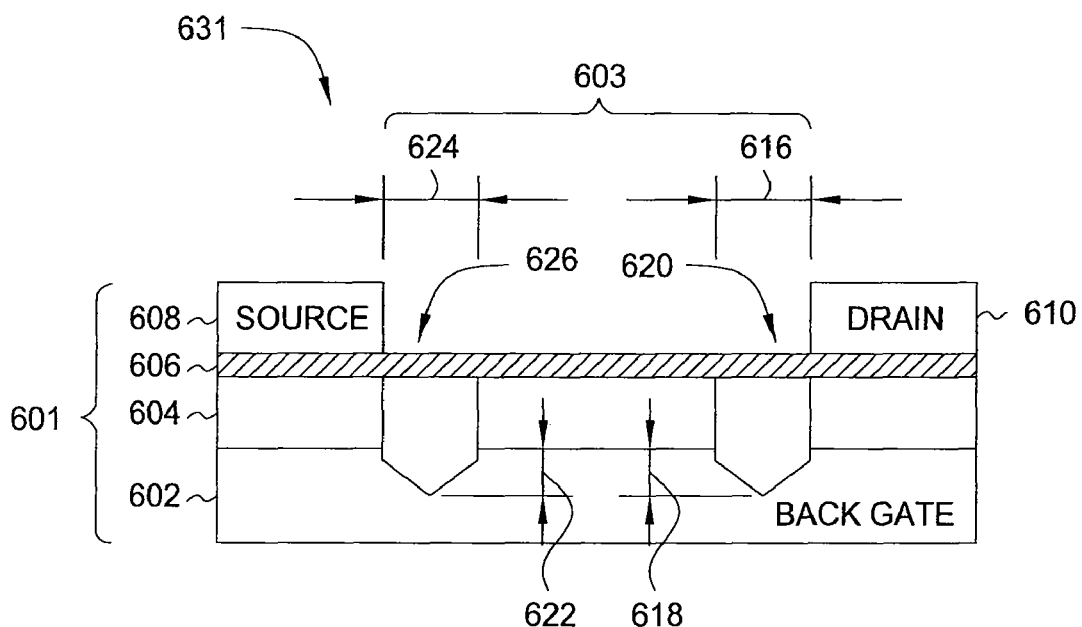

At step 510, in addition to the trench(es) 620, at least one trench 626 is formed, substantially perpendicular to the nanotube 606, in the gate dielectric layer 604 and the back gate layer 602 proximate to the source electrode 610. In the depicted exemplary embodiment, a single trench 626 is illustratively shown (FIGS. 7A-7B). Steps 506 and 510 may use a photo- or e-beam resist mask 615 that is patterned for etching both the trenches 620 and 626 and use the same etching chemistries, as well as be performed simultaneously. Similar to trenches 620, the trenches 626 are generally formed to widths 624 of about 10 to 150 nm and depth 622 of about 10 to 150 nm, as well as have lengths of about 100 to 10000 nm.

At step 512, the nanotube 606 is selectively doped in the trench(es) 626 using the dopants and the doping process described above in reference to step 508. In one exemplary embodiment, the nanotube 606 is simultaneously doped in the trenches 620 and 626. During the doping process, in the channel region 603, the nanotube 606 is protected from dopants by the resist mask 615. Upon completion of the doping process, the resist mask 615 is removed using, e.g., the Aceton chemistry (FIG. 7B) and, at step 514, the method 500 ends.

Figure 8:
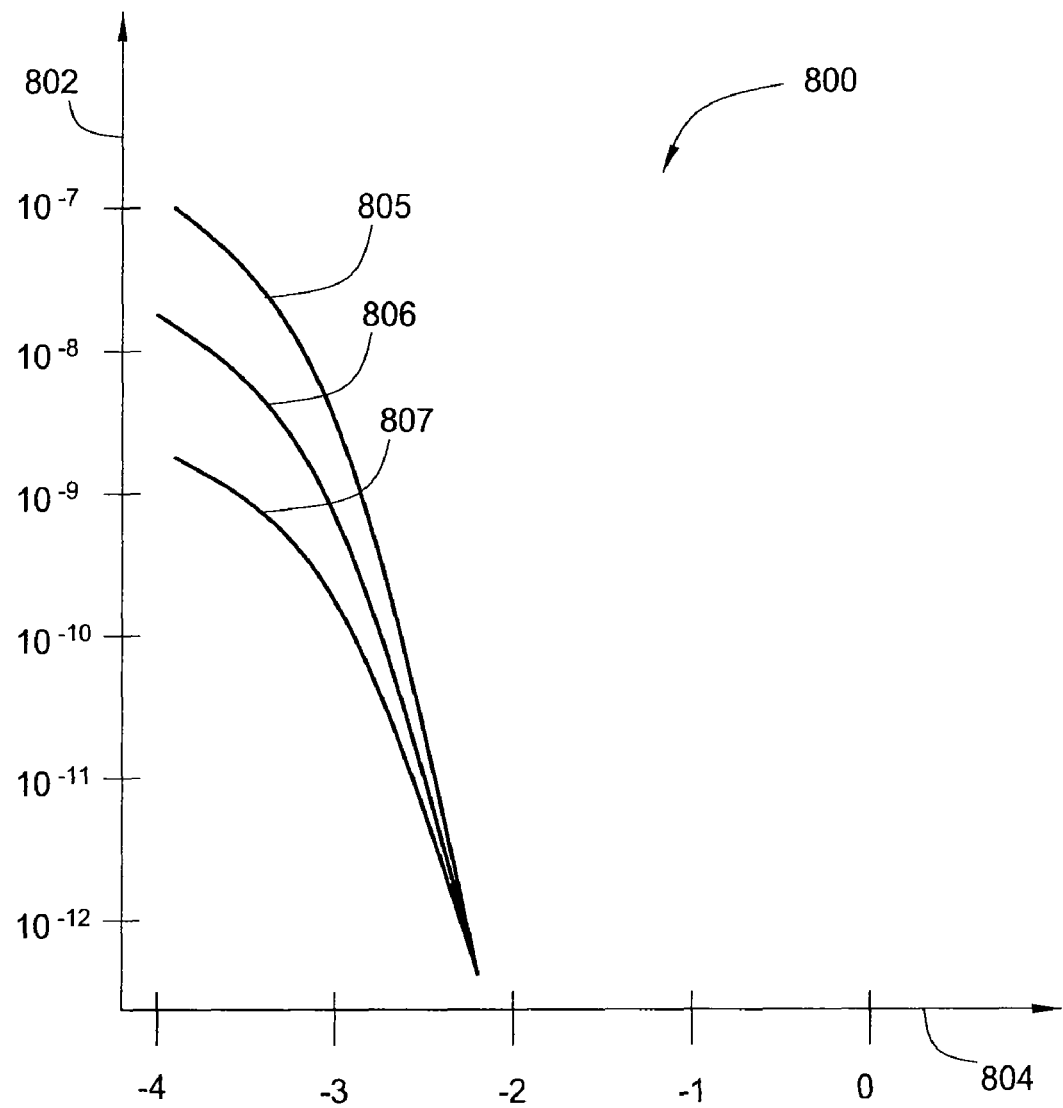
FIG. 8 depicts a series of exemplary graphs illustrating characteristics of an exemplary nanotube field-effect transistor fabricated using the method of FIG. 5.

FIG. 8 depicts a series 800 of exemplary graphs 805-807 illustrating dependence of an output current $I_d$ (y-axis 802, in unit of ampere) from a gate voltage $V_{gs}$ (x-axis 804, in unit of volt) of the p-type NFET 621 (discussed in reference to FIGS. 6A-6D above). The NFET 621 is fabricated using the method 500 of FIG. 5. In the operating ranges of the gate electrode, drain, and back gate electrode voltages, the NFET 621 has unipolar characteristics, as well as an inverse sub-threshold slope of about 100 to 150 mV/dec. For example, the data points in the graphs 805-807 are acquired at the drain voltages $V_d$ equal to −0.8V, −0.5V, and −0.3V, respectively, and the gate voltage $V_{gs}$ controlled in a range from −4V to +1V.

In this embodiment, the NFET 621 comprised a single trench 620 having the width 616 and depth 618 of about 150 nm and 100 nm, respectively, and the carbon nanotube 606 was undoped. The gate dielectric layer 604 of the transistor was formed from $SiO_2$ to a thickness of about 10 nm.

Further improved performance can be obtained by the NFET 631 (discussed in reference to of FIGS. 7A-7B above) having the nanotube 606 doped in both trenches 620 and 626 using the above dopants to achieve degenerately doped nanotube segments also demonstrating unipolar characteristics shown in FIG. 8 but with an improved inverse subthreshold slope of around 60 mV/dec.

While the foregoing is directed to the illustrative embodiment of the present invention, other and further embodiments of the invention may be devised without departing from the basic scope thereof, and the scope thereof is determined by the claims that follow.

The invention claimed is:

1. A nanotube field-effect transistor, comprising:
   a back gate electrode;
   a gate dielectric disposed on the back gate electrode;
   a local gate electrode and an insulating layer disposed on the gate dielectric;
   a nanotube disposed on the insulating layer and the gate dielectric, where said nanotube has a central region disposed on the insulating layer and a first end and a second end disposed on the gate dielectric;
   a source electrode formed on the first end of the nanotube, where the source electrode is separated from the central region and from the local gate electrode by a first region of the nanotube; and
   a drain electrode formed on the second end of the nanotube, where the drain electrode is separated from the central region and from the local gate electrode by a second region of the nanotube.

2. The transistor of claim 1, wherein the nanotube is formed from at least one of: C, Si, GaAs, InP, or InGaAs.

3. The transistor of claim 1, wherein:
   the gate dielectric is formed from at least one of: $SiO_2$, $HfO_2$, and $Al_2O_3$, or quartz to a thickness of about 1 to 10000 nm; and
   the back gate electrode is formed from Si or degenerately doped Si.

4. The transistor of claim 1, wherein the local gate electrode is formed from a metal or a conductive compound.

5. The transistor of claim 1, wherein the local gate electrode is formed from Al or Mo, and wherein the insulating layer is formed from $Al_2O_3$.

6. The transistor of claim 1, wherein the nanotube is disposed substantially orthogonally to an axis of longitudinal symmetry of the local gate electrode.

7. The transistor of claim 1, wherein the source electrode and the drain electrode are formed from at least one: of a metal, an alloy of a metal, or a conductive compound.

8. The transistor of claim 1, wherein the local gate electrode is spaced apart from the source electrode and from the gate electrode in a lateral direction.

9. The transistor of claim 1, wherein the first region and the second region are doped.

10. The transistor of claim 9, wherein the first region and the second region are each doped to degenerate doping levels.

11. The transistor of claim 9, wherein the first region and the second region are doped using at least one of: $Cl_2$ or $Br_2$.

12. The transistor of claim 9, wherein the first region and the second region are doped using at least one of: K, Na, or polyethylenimine.

13. The transistor of claim 9, wherein the central region is undoped.

* * * * *